United States Patent
McCall et al.

(10) Patent No.: US 6,700,457 B2
(45) Date of Patent: Mar. 2, 2004

(54) IMPEDANCE COMPENSATION FOR CIRCUIT BOARD BREAKOUT REGION

(75) Inventors: James A. McCall, Beaverton, OR (US); Steven M. Stahlberg, Salem, OR (US); David N. Shykind, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 213 days.

(21) Appl. No.: 10/033,831

(22) Filed: Dec. 26, 2001

(65) Prior Publication Data

US 2003/0116831 A1 Jun. 26, 2003

(51) Int. Cl.[7] .............................................. H03H 7/38
(52) U.S. Cl. ....................... 333/33; 333/34; 333/247; 257/775; 361/777; 174/261
(58) Field of Search ....................... 333/34, 33, 246, 333/247, 236; 257/775; 361/777; 174/261

(56) References Cited

U.S. PATENT DOCUMENTS

| | | | | |
|---|---|---|---|---|
| 5,184,095 A | * | 2/1993 | Hanz et al. | 333/33 |
| 5,194,833 A | * | 3/1993 | Dougherty et al. | 333/33 |
| 5,880,657 A | * | 3/1999 | Dorschky et al. | 333/246 |
| 6,366,466 B1 | * | 4/2002 | Leddige et al. | 361/760 |
| 6,518,663 B1 | * | 2/2003 | James et al. | 257/734 |

OTHER PUBLICATIONS

U.S. patent application, pending, Ser. No. 09/724,634, filed Nov. 28, 2000 to Michael W. Leddige et al.
David M. Pozar, "Microwave Engineering", John Wiley & Sons, Inc. Second Edition, 1998. pp. 276–297.
Theodore Moreno, "Microwave transmission design data", Sperry Gyroscope Company, 1958. pp. 50–54.
J.C. Slater, "Microwave Transimmion", McGraw–Hill Book Company, Inc., 1942. pp. 42–45.

* cited by examiner

Primary Examiner—Robert Pascal
Assistant Examiner—Stephen E. Jones
(74) Attorney, Agent, or Firm—Alan K. Aldous

(57) ABSTRACT

In some embodiments, the invention includes system comprising a circuit board including a circuit board trace. This system includes a packaged chip supported by the circuit board including, the packaged chip having a package, wherein the circuit board trace is connected to the package in a circuit board breakout region, and wherein the circuit board trace includes a fan-out trace section having an impedance Zo1, a matching region trace section having an impedance Zo2, and a package trace compensation section having an impedance Zo3, wherein an effective impedance of the matching region trace section and the package trace compensation section is approximately equal to impedance Zo1, where Zo3<Zo1<Zo2.

18 Claims, 6 Drawing Sheets

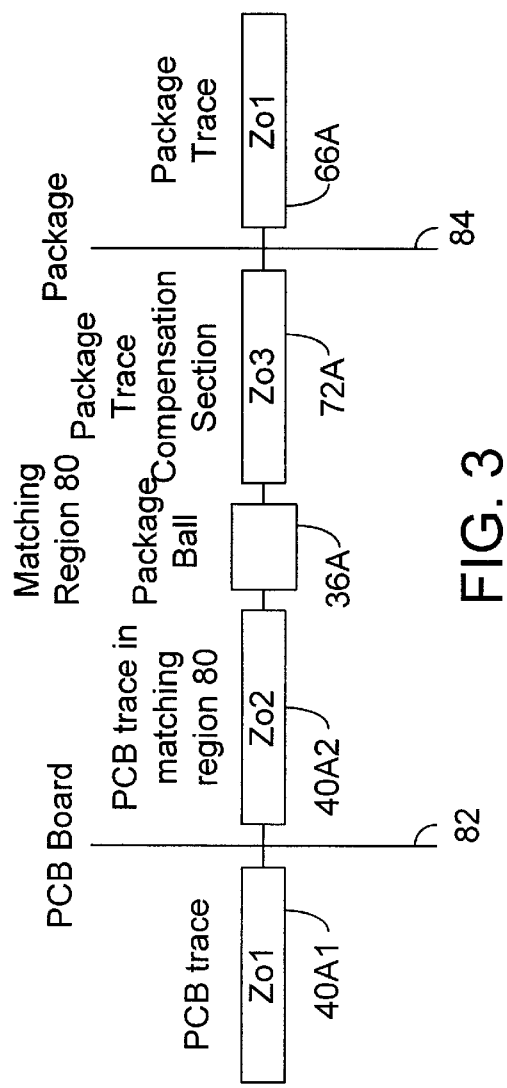
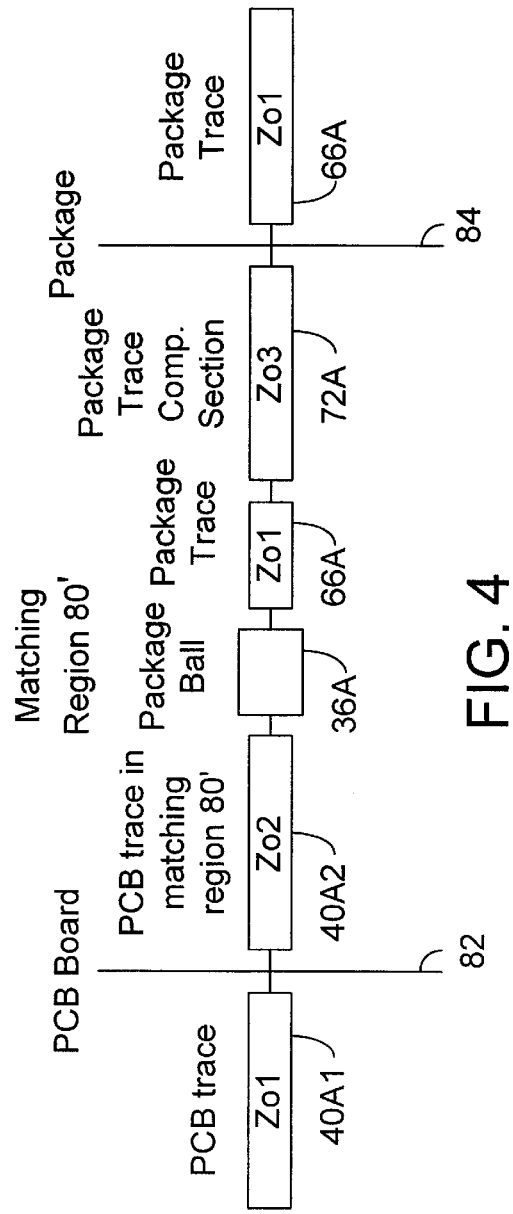

IMPEDANCE COMPENSATION FOR CIRCUIT BOARD BREAKOUT REGION

BACKGROUND OF THE INVENTION

1. Technical Field of the Invention

The present inventions relate to circuit boards, more particularly, to impedance compensation for circuit board breakout regions.

2. Background Art

Circuit boards, such as printed circuit boards (PCBs), have chips (integrated circuits or die) on one or both sides of the circuit board. The chips are typically protected by a package. A variety of connection approaches may be used to make connections between the PCB, package, and die. The interface of the PCB with the package often has a circuit board breakout region where the traces from package balls are more densely populated for a small length prior to fanning out on the PCB. This may be used to interface the larger PCB physical features with the smaller package features.

A typical prior art approach is illustrated schematically in FIG. 1. Referring to FIG. 1, a system 10 includes a packaged chip 14 supported by a PCB 16. Packaged chip 14 includes a die 22 and an associated package 20. Support 24 is a portion or portions of package 20 that supports traces. For ease of illustration, die 22 is shown on an edge of package 20, but that is not required in actual use. Die 22 has die bumps 26 of which die bumps 26A, 26B, 26C, 26D, 26E, and 26F are illustrated. Die bumps 26 are an interface between package traces 30 and internal circuitry of the die. Package 20 has package balls of which package balls 36A, 36B, 36C, 36D, 36E, 36F, 36G, and 36H are illustrated. Package traces 30 couple corresponding die bumps 36 and package balls 26. For example, package trace 30A couples package ball 36A to die bump 26A, package trace 30B couples package ball 36B to die bump 26B, etc.

PCB traces 40 are positioned on PCB 16. Examples of PCB traces 40 include traces 40A, 40B, 40C, 40D, 40E, and 40F. PCB traces 40 from PCB 16 couple to corresponding package balls 36. For example, PCB trace 40A couples to package ball 36A, PCB trace 40B couples to package ball 36B, etc. PCB 16 includes multiple layers and different ones of traces 40 may be in different layers of or on the same layer of PCB 16 and can change layers through vias.

A PCB breakout region 38 is a region in which PCB traces 40 connect to package balls 36. There is a relatively small amount of space for traces 40 to connect to package balls 36 when compared with the amount of space on PCB 16 for traces 40 to be positioned. Generally, there is a higher density of traces 40 in breakout region 38 than outside breakout region 38. Density refers to the number of portions of traces that are included in a unit area. With a higher density of traces, there may be a greater danger of problems such as cross-talk. One way to allow the higher density in breakout region 38 while reducing cross-talk or similar problems is to have traces 40 be narrower inside breakout region 38 than outside. For example, section 40A2 of trace 40A is narrower than is section 40A1 of trace 40. Traces 40 are illustrated as fanning out at different angles, but this is shown to illustrate a lower trace density, not to show an actual fan-out. The actual position of traces in the fan-out may be different than that illustrated.

The impedances Zo of the narrower portions of traces 40 in breakout region 38 (e.g., trace section 40A2) are greater than those wider portions outside breakout region 38 (e.g., trace section 40A1). This presents an impedance discontinuity to signals propagated through this region, which is not desired. Impedance discontinuities can create unwanted reflections, thereby slowing the speed at which signals can be reliably switched. Merely as an example, the impedances of traces 40 may be 50 ohms outside breakout region 38, but increase to 60 ohms where PCB traces narrow inside breakout region 38. Package traces 30 may be 50 ohms again.

A package breakout region 32 refers to a region in which package traces 30 connect to die bumps 26. The density of package traces 30 may be generally lower between PCB breakout region 38 and package breakout region 32 than in either PCB breakout region 38 or package breakout region 32. Although package traces 30 are narrower than PCB traces 40, the impedance of package traces 30 may be the same as PCB traces 40 where other dimensions such as the distance between the trace and ground plane are also scaled.

The impact of an impedance discontinuity increases as the frequencies of signals on the traces increases.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

The drawings of this application are shown schematically. The shapes and relative sizes of the components of the drawings are chosen for convenience in illustrating and are not intended to be in an actual relative scale.

FIG. 3 is a schematic representation of impedances at different positions of a PCB trace and a package trace, including a package trace compensation section, according to some embodiments of the invention.

FIG. 4 is a schematic representation of impedances at different positions of a PCB trace and a package trace, including a package trace compensation section, according to some embodiments of the invention.

DETAILED DESCRIPTION

The present invention involves techniques to compensate for impedance discontinuities in breakout regions. The discontinuity is created because it is impractical (e.g. too expensive) to avoid using a higher impedance trace section in the breakout region. A lower impedance trace section, called a package trace compensation section, is positioned very close to a higher impedance trace section, called a matching region trace section. The lower and higher impedance trace sections together have an effective impedance that is approximately the same as adjacent trace sections. If the trace sections are properly designed, a signal on the traces reacts to the combination of higher and lower impedance sections as if they were one section of constant impedance.

Figure 1:
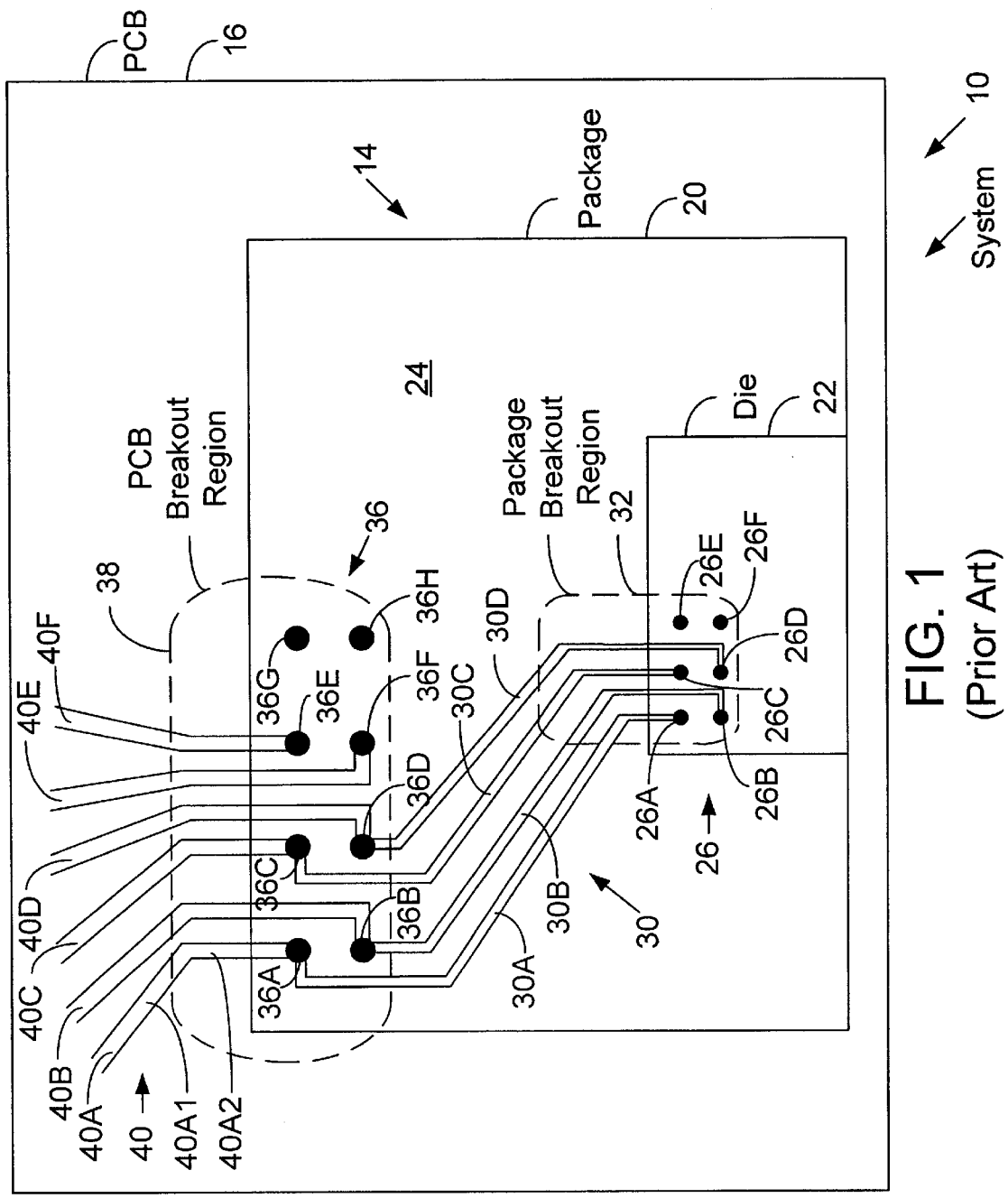
FIG. 1 is a schematic plan view representation of a prior art system including a circuit board, package, die, and associated traces.
Figure 2:
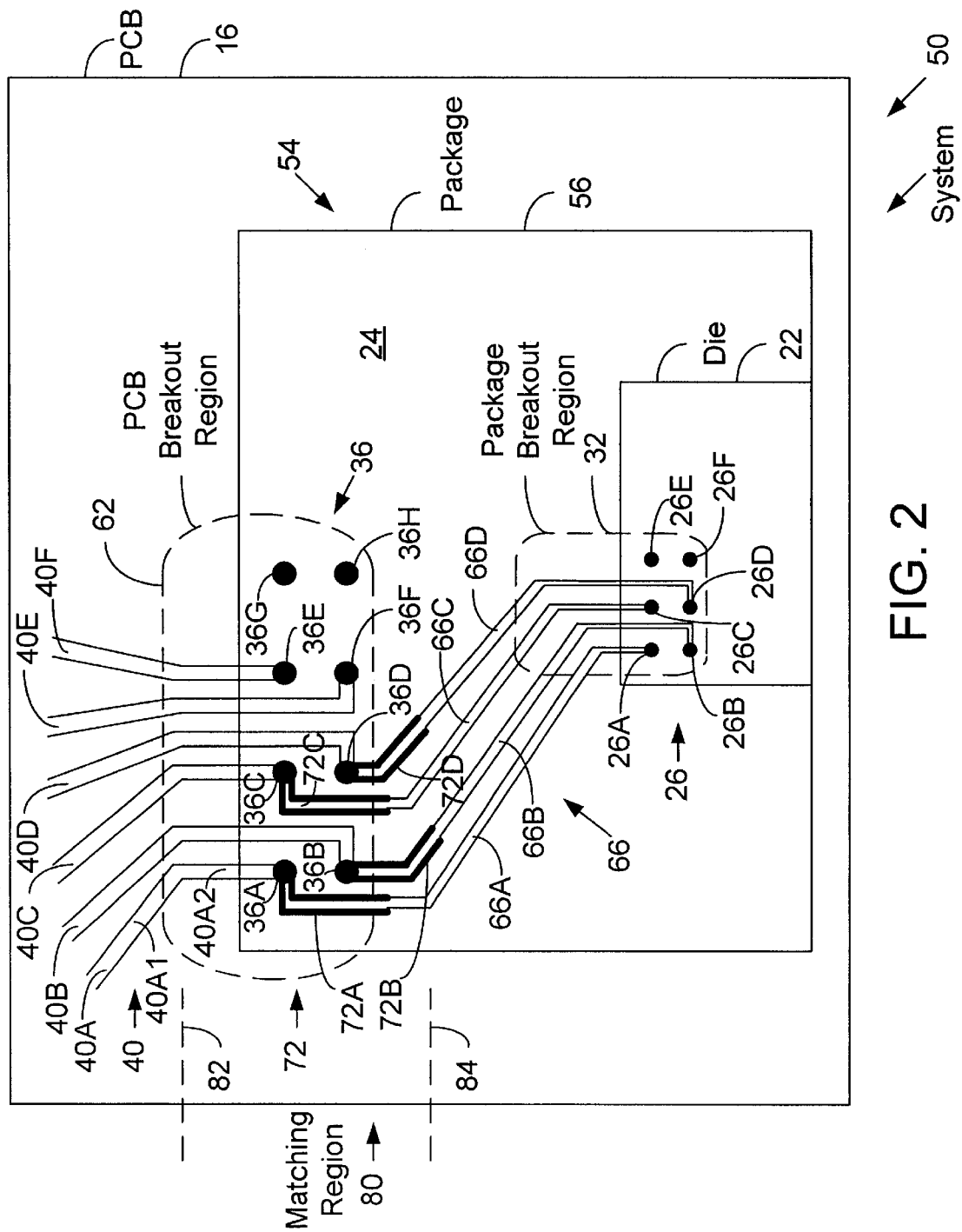
FIG. 2 is a schematic plan view representation of a system including a circuit board, package, die, and associated traces, including package trace compensation sections, according to some embodiments of the present invention.

FIG. 2 is a schematic representation of a system 50 which includes a packaged chip 54 supported by a PCB 16. Packaged chip 54 includes a die 22 and an associated package 56. Support 24 is a portion or portions of package 56 that supports traces. Different traces may be supported at different levels of package 56. System 50 of FIG. 2 is generally similar to system 10 of FIG. 1, but includes improvements described as follows. In system 50, die 22 has die bumps 26 of which die bumps 26A, 26B, 26C, 26D, 26E, and 26F are illustrated. Package 56 has package balls of which package balls 36A, 36B, 36C, 36D, 36E, 36F, 36G, and 36H are illustrated. The invention is not limited to a particular number of die dumps or package balls, and may be used with pins in place of balls. Balls, pins, and die bumps are each examples of terminals. The invention is not limited to particular packaging techniques. The invention may be implemented with or without pin grid arrays, ball grid arrays, and flip chip arrangements. The traces may include wirebonds. The die may be encapsulated or not encapsulated. Package 56 may include an interposer such as PCB. Support 24 may be part of a circuit board. The interface between PCB 16 and package 56 may include a socket and/or balls pads. Traces 40 may join to package 56 from the same side or a different side than die 22. Die may be on both sides (top and bottom) of package 56. More than one die may be on the same side.

PCB traces 40 are positioned on PCB 16 and extend to package balls 36. Examples of PCB traces 40 include traces 40A, 40B, 40C, 40D, 40E, and 40F. PCB traces 40 from PCB 16 connect to corresponding package balls 36. For example, PCB trace 40A connects to package ball 36A, PCB trace 40B connects to package ball 36B, etc. PCB 16 includes multiple layers and different ones of traces 40 may be in different layers of or on the same layer of PCB 16 and can change layers through vias. Traces 40 are illustrated as fanning out at different angles, but this is shown to illustrate a lower density, not to show an actual fan-out. The actual position of traces in the fan-out may be different than that illustrated.

Package traces 66 include multiple traces of which traces 66A, 66B, 66C, and 66D are illustrated. The positions of these traces is chosen for ease of illustration and not intended to restrict actual positions in the package. Package traces 66 couple corresponding die bumps 26 and package balls 36. For example, package trace 66A couples package ball 36A to die bump 26A, package trace 66B couples package ball 36B to die bump 26B, etc. Although package traces 66 are narrower than PCB traces 40, the impedance of package traces 30 may be the same as PCB traces where other dimensions such as the distance between the trace and ground plane are also scaled.

A PCB breakout region 62 is a region in which PCB traces 40 connect to package balls 36. There is a relatively small amount of space for traces 40 to connect to package balls 36 when compared with the amount of space on PCB 16 for traces 40 to be positioned. Generally, there is a higher density of traces 40 in breakout region 62 than outside breakout region 62. Density refers to the number of portions of traces are included in a unit area. As explained above, with a higher density of traces, there may be a greater danger of problems such as cross-talk. One way to permit the higher density in breakout region 62 without associated problems is to have traces 40 be narrower inside breakout region 62 than outside. For example, section 40A2 of trace 40A is narrower than is section 40A1 of trace 40. Trace section 40A1 is generally outside breakout region 62 and trace section 40A2 is generally inside breakout region 62. Trace section 40A1 is referred to herein as fan-out trace section 40A1. Trace section 40A2 is referred to herein as matching region trace section 40A2.

Matching region 80 is shown between lines 82 and 84. Matching region 80 includes the narrower section of the matching region sections (e.g., 40A2) and the package trace compensation sections 72 (e.g., 72A). Other package trace compensation sections 72 include 72B, 72C, 72D, etc. Package trace compensation sections are shown in dark lines for ease of identification. Lines 82 and 84 are somewhat arbitrarily positioned in FIG. 2 because the actual extent of matching region 80 may be different for each trace.

Impedance discontinuities are illustrated in FIGS. 2, 3, and 4. For example, the fan-out trace sections (e.g., trace 40A1) may impedances Zo1 and the matching region trace sections (e.g., trace 40A2) have impedances Zo2. Package traces 66 also have impedances Zo1 except for the package trace compensation sections 72 (e.g., 72A) which have impedances Zo3. If properly designed, the combination of a fan-out trace section and a package trace compensation section will have an effective impedance very close to Zo1. There are different measures of how close the effective impedance is to Zo1. As used in this disclosure, in this context, the term, "approximately equal" means the absolute value of (the effective impedance−Zo1)/Zo1 is ≦0.10. The term, "substantially equal" means the absolute value of (the effective impedance−Zo1)/Zo1 is ≦0.05. The term, "essentially equal" means the absolute value of (the effective impedance−Zo1)/Zo1 is ≦0.02. The term "virtually equal" means the absolute value of (the effective impedance−Zo1)/Zo1 is ≦0.01. In the context of comparing the impedances of different ones of the same type of traces (e.g., different ones of PCB traces 40, different ones of package trace compensation sections 72, etc.), the term "substantially equal" means each trace has an impedance within ±0.05 of the designed impedance (e.g., each trace is within ±0.05 of Zo1). The term "essentially equal" means each trace has an impedance within ±0.02 of the designed impedance (e.g., each trace is within ±0.02 of Zo1). The term "virtually equal" means each trace has an impedance within ±0.01 of the designed impedance (e.g., each trace is within ±0.01 of Zo1).

Merely as an example, Zo1 may be 50 ohms, Zo2 may be 60 ohms, and Zo3 may be 40 ohms, although other values may be used. The invention may be used even if there are other impedances values for various sections of the traces. The impedance of the package balls 36 may be designed to be close to the impedance of one of Zo1, Zo2, and Zo3 or different than Zo1, Zo2, and Zo3. The impedance of package balls 36 may be ignored for purposes of this invention. Alternatively, the impedance of package balls 36 may be considered in choosing the impedance values of the package trace compensation sections. (In FIG. 3, the horizontal lines between the traces are merely provided for convenience in showing the transitions between trace sections or package ball and trace sections.)

In many cases, each of the matching region trace sections will have the same impedance value (Zo2). However, in other cases, different matching region trace sections may have different impedance values. In that case, different package trace compensation sections may have correspondingly different impedance values.

FIG. 4 is similar to FIG. 3 except that in FIG. 4 there is an intermediate section of package trace 66A between package ball 36A and package trace compensation section 72A in matching region 80'. There may be a short section of one of the package traces 66 between the package ball and package trace compensation section for some traces and not others.

FIGS. 3 and 4 can be used to show how the design would be tuned to optimize the package trace compensation sections. The design target for the package trace compensation section can be estimated to a first order by the equation shown below:

$$Zo1 = \sqrt{\frac{Lzo2 + Lzo3}{Czo2 + Czo3}}$$

where Czo2, Lzo2, Czo3, Lzo3, etc are the respective distributed capacitance and inductance per unit length for the Zo2 and Zo3 regions. The designer may want to consider the desired signal frequency as well. The goal is to match the overall region to the target design Zo1.

Figure 6:
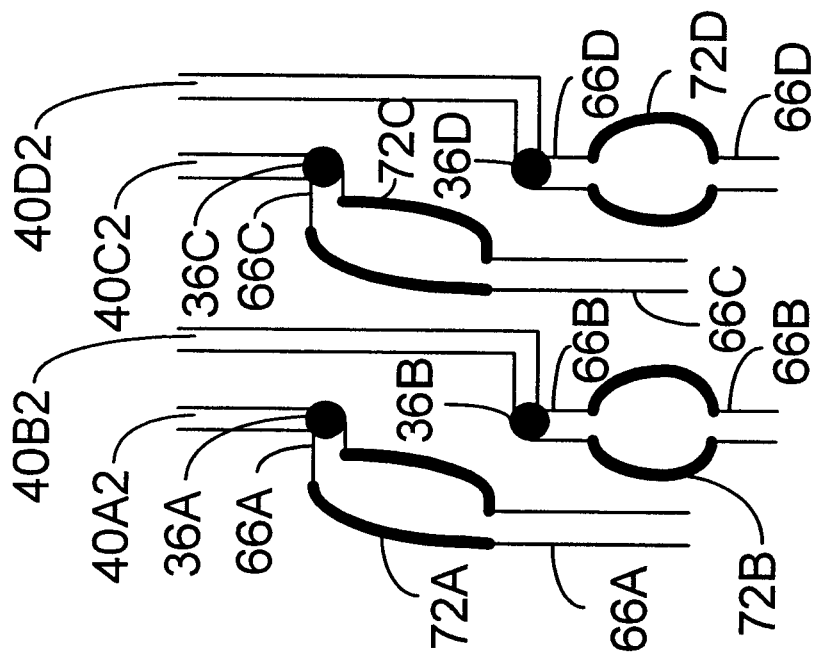
FIG. 6 is a schematic view of PCB traces, package balls, and package traces, including package trace compensation sections, according to some embodiments of the invention.
Figure 5:
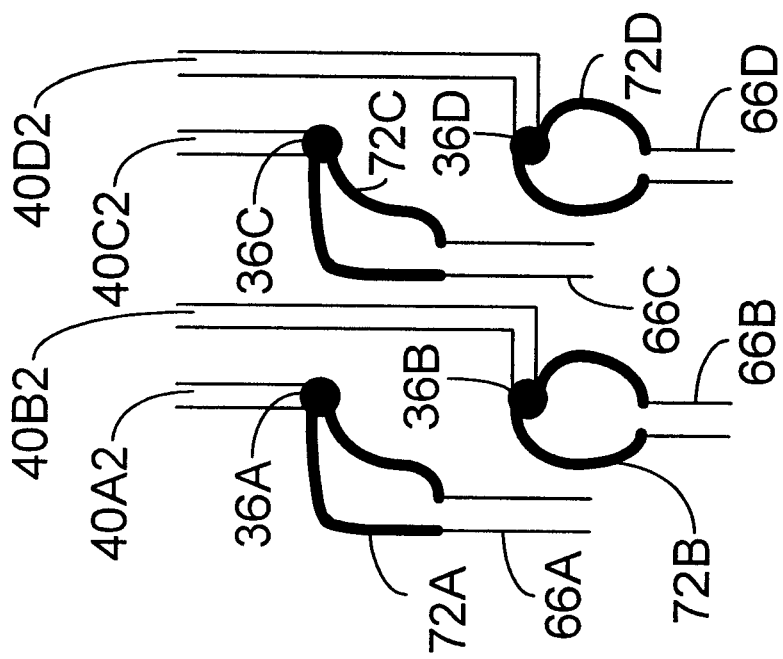
FIG. 5 is a schematic view of PCB traces, package balls, and package traces, including package trace compensation sections, according to some embodiments of the invention.

The package trace compensation may have any of a variety of shapes. FIGS. 5 and 6 illustrate only some of these shapes. It is believed that a desired effective impedance in the matching region is more likely to be achieved for relatively high signal frequencies if the package trace compensation section is quite short. FIG. 5 illustrates package trace compensation sections 72A and 72C as looking the same as each other but different than package trace compensation sections 72B and 72D. Alternatively, each package trace compensation section could look the same or each could look different than the others. The trace layout designer can take advantage open space around the relatively low density around package balls 36 to place package trace compensation sections.

FIG. 6 is similar to FIG. 5 but includes an intermediate section of package traces 66 between package balls 36 and package trace compensation sections 72. In FIG. 5, none of the traces include an intermediate section of package traces 66, while in FIG. 6 all of the traces include the intermediate section (as in FIG. 4). Alternatively, some of the traces could include an intermediate section, while others do not.

Figure 7:
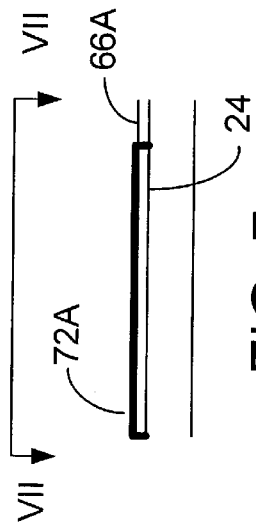
FIG. 7 is a schematic side view of a package trace compensation section and package trace according to some embodiments of the invention.
Figure 8:
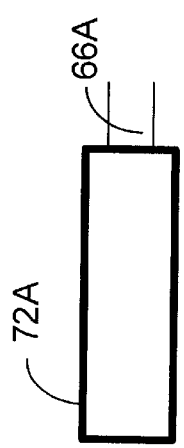
FIG. 8 is a schematic top view of the package trace compensation section and package trace of FIG. 7 as viewed from VII—VII according to some embodiments of the invention.
Figure 9:
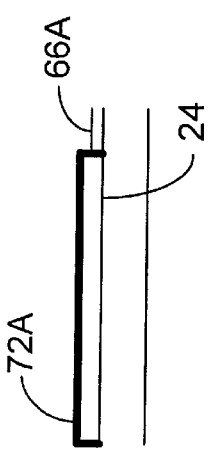
FIG. 9 is a schematic side view of a package trace compensation section and package trace according to some embodiments of the invention.

Under one approach, package trace compensation sections 72 are applied to the package support 24 at the same time as package traces 66. This approach is illustrated in FIGS. 7–9. Under another approach, package traces 66 are first applied to package support 24 and then, package trace compensation sections 72 are applied on top of package traces 66. This approach is illustrated in FIGS. 10–12.

FIG. 7 is a schematic cross-sectional side view of FIG. 2. FIG. 8 shows a plan view of what is illustrated in FIG. 7 as viewed from VII—VII. Package trace compensation section 72A is illustrated in rectangular form. However, the invention is not so limited. FIG. 9 is similar to FIG. 7, but the height of package trace compensation section 72A is greater than that of package trace 72A.

Figure 10:
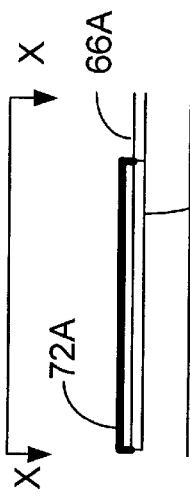
FIG. 10 is a schematic side view of a package trace compensation section and package trace according to some embodiments of the invention.
Figure 11:
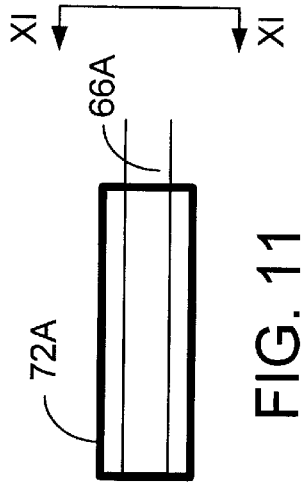
FIG. 11 is a schematic top view of the package trace compensation section and package trace of FIG. 10 as viewed from X—X according to some embodiments of the invention.

FIG. 10 is a schematic cross-sectional side view of FIG. 2 in which package trace compensation section 72 is deposited on top of package trace 66A. FIG. 11 shows a plan view of what is illustrated in FIG. 10 as viewed from X—X. Package trace compensation section 72A is illustrated in rectangular form. However, the invention is not so limited. FIG. 12 shows a front view of FIG. 11 as viewed from XI—XI.

Figure 12:
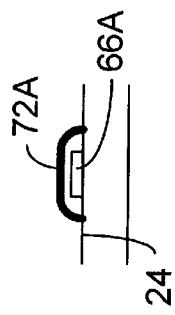
FIG. 12 is a schematic front view of the package trace compensation section and package trace of FIG. 11 as viewed from XI—XI according to some embodiments of the invention.

A front view of FIG. 9 may look similar to FIG. 12, but with package trace 66A not extending beneath package trace compensation section 72A.

Figure 13:
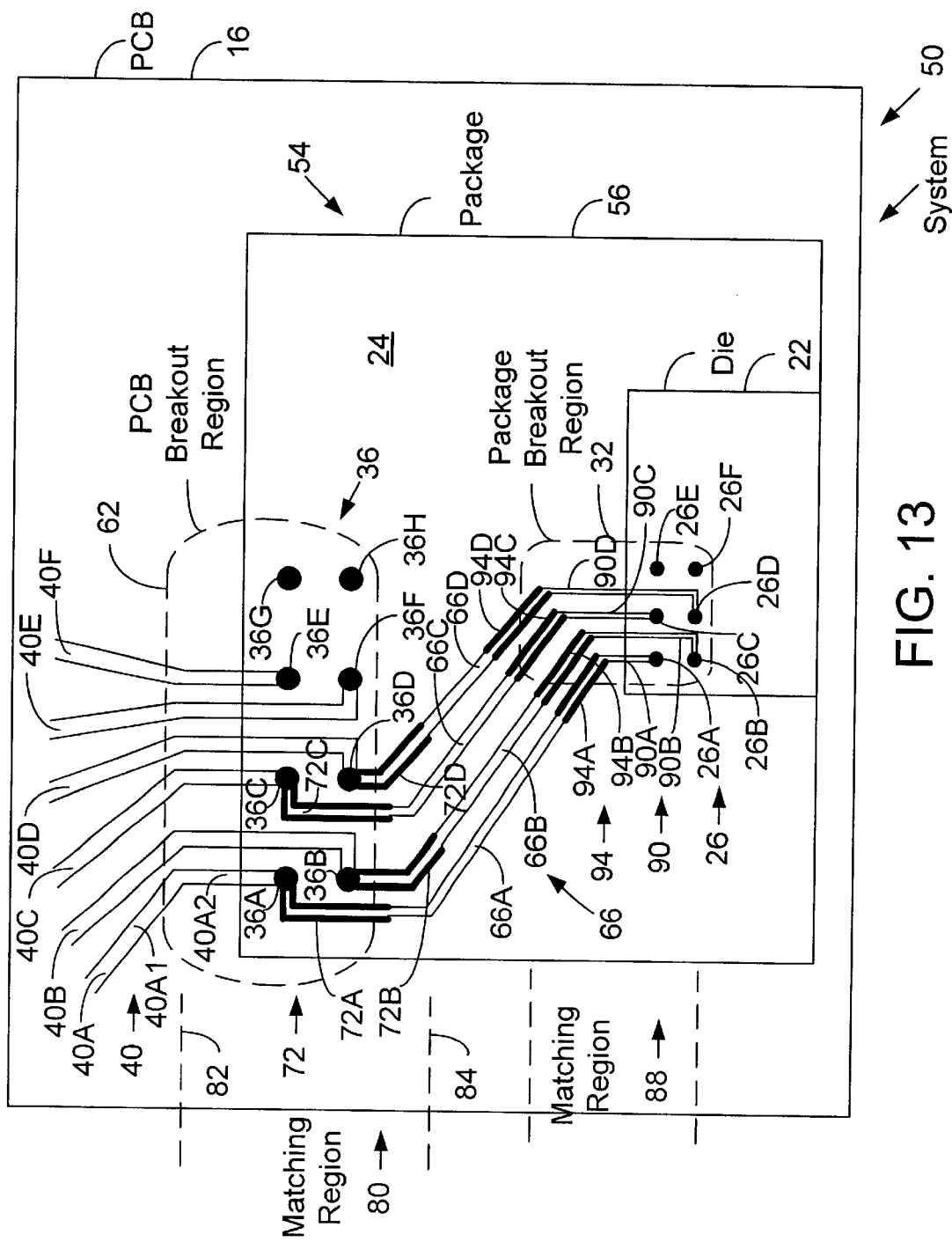
FIG. 13 is a schematic plan view representation of a system including a circuit board, package, die, and associated traces, including package trace compensation sections, according to some embodiments of the present invention.

Referring to FIGS. 2 and 13, a package breakout region 32 refers to a region in which package traces 30 connect to die bumps 26. The density of package traces 66 may be generally lower between PCB breakout region 62 and package breakout region 32 than in either PCB breakout region 62 or package breakout region 32.

FIG. 13 illustrates how the package trace compensation sections may be in a matching region 88 associated with the package breakout region 32. As with matching region 80, only the general region of matching region 88 is shown with dashed lines. In the example of FIG. 13, matching region trace sections 90 (including 90A, 90B, 90C, 90D etc.) have higher impedances than do most of package traces 66. Package trace compensation sections 94 (including 94A, 94B, 94C, 94D etc) have a lower impedances so the combination of sections 90 and 94 have an effective impedance that is about the same as Zo1. The invention may be practiced in only matching section 80 or only matching section 88 or in both matching sections 80 and 88. The impedances of the matching region trace sections 88 are Zo4 which may be the same as or different than Zo2 and the impedances of the package trace compensation sections 94 are Zo5 which may be the same as or different than Zo3.

The traces may be made of a variety of materials including copper and aluminum. The material of package trace compensation sections 72 may be the same as or different than the materials of other portions of package traces 66.

The traces shown herein are not required to be applied as continuous material. For example, they could include breaks such as vias.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A system comprising:
   a circuit board including a circuit board trace; and
   a packaged chip supported by the circuit board, the packaged chip having a package, wherein the circuit board trace is connected to the package in a circuit board breakout region, and wherein the circuit board trace includes a fan-out trace section having an impedance Zo1, a matching region trace section having an impedance Zo2, and a package trace compensation section having an impedance Zo3, wherein an effective impedance of the matching region trace section and the package trace compensation section is approximately equal to impedance Zo1, where Zo3<Zo1<Zo2.

2. The system of claim 1, wherein the matching region trace section and the package trace compensation section each are connected to a package terminal.

3. The system of claim 2, wherein the package terminal is a package ball.

4. The system of claim 1, wherein the matching region trace section is connected to a package terminal, but there is an intermediate package trace section between the package terminal and the package trace compensation section.

5. The system of claim 1, wherein the package compensation trace section is positioned on top of at least part of a package trace.

6. The system of claim 1, wherein the effective impedance is substantially equal to Zo1.

7. The system of claim 1, wherein the effective impedance is essentially equal to Zo1.

8. The system of claim 1, further comprising:
   a die;
   a package trace connected to the package compensation trace section, the package trace including:
   (a) at least one section having an impedance Zo1,
   (b) a matching region trace section to interface with the die, the matching region trace section having an impedance Zo4, and
   (c) a package trace compensation section having an impedance Zo5, wherein an effective impedance of the matching region trace section and the package trace compensation section is roughly equal to impedance Zo1, where Zo5<Zo1<Zo4.

9. The system of claim 8, wherein Zo4=Zo2 and Zo5=Zo3.

10. A system comprising:
    a circuit board including circuit board traces; and
    a packaged chip supported by the circuit board, the packaged chip having a package, wherein the circuit board traces are connected to the package in a circuit board breakout region, and wherein the circuit board traces include fan-out trace sections each having an impedance essentially equal to Zo1, a matching region trace section each having an impedance essentially equal to Zo2, and a package trace compensation section each having an impedance essentially equal to Zo3, wherein effective impedances of the matching region trace sections and corresponding ones of the package trace compensation sections are each approximately equal to impedance Zo1, where Zo3<Zo1<Zo2.

11. The system of claim 10, wherein the package compensation trace sections are positioned on top of at least part of a corresponding package trace.

12. The system of claim 10, wherein the effective impedances are substantially equal to Zo1.

13. The system of claim 10, wherein the effective impedances are essentially equal to Zo1.

14. A system comprising:
    a die;
    a package trace including:
    (a) at least one section having an impedance Zo1,
    (b) a matching region trace section to interface with the die, the matching region trace section having an impedance Zo4, and
    (c) a package trace compensation section having an impedance Zo5, wherein an effective impedance of the matching region trace section and the package trace compensation section is roughly equal to impedance Zo1, where Zo5<Zo1<Zo4.

15. The system of claim 14, wherein the package compensation trace section is positioned on top of at least part of a corresponding package trace.

16. The system of claim 14, wherein the effective impedance is substantially equal to Zo1.

17. The system of claim 14, wherein the effective impedance is essentially equal to Zo1.

18. A system comprising:
    a die;
    package traces each including:
    (a) at least one section having an impedance essentially equal to Zo1,
    (b) a matching region trace section to interface with the die, the matching region trace section having an impedance essentially equal to Zo4, and
    (c) a package trace compensation section having an impedance essentially equal to Zo5, wherein an effective impedance of the matching region trace section and the package trace compensation section is roughly equal to impedance Zo1, where Zo5<Zo1<Zo4.

* * * * *